United States Patent
Lida et al.

(10) Patent No.: US 9,401,729 B2
(45) Date of Patent: Jul. 26, 2016

(54) MAINTAINING RUNNING DISPARITY WHILE UTILIZING DIFFERENT LINE-CODES

(71) Applicant: Valens Semiconductor Ltd., Hod Hasharon (IL)

(72) Inventors: Eyran Lida, Kfar Ha-Oranim (IL); Aviv Salamon, Raanana (IL)

(73) Assignee: Valens Semiconductor Ltd., Hod Hasharon (IL)

( * ) Notice: Subject to any disclaimer, the term of this patent is extended or adjusted under 35 U.S.C. 154(b) by 265 days.

(21) Appl. No.: 14/170,826

(22) Filed: Feb. 3, 2014

(65) Prior Publication Data

US 2015/0222293 A1    Aug. 6, 2015

(51) Int. Cl.
*H03M 13/00* (2006.01)
*H03M 13/19* (2006.01)
*H03M 5/00* (2006.01)
*H04L 1/00* (2006.01)

(52) U.S. Cl.
CPC ............... *H03M 13/19* (2013.01); *H03M 5/00* (2013.01); *H04L 1/0041* (2013.01); *H04L 1/0057* (2013.01)

(58) Field of Classification Search
CPC ............. H03M 1/0064; H03M 13/19; H03M 13/1575; H03M 1/285; G06F 11/1048; H04L 25/49; H04L 1/0041; H04L 1/0057
See application file for complete search history.

(56) References Cited

U.S. PATENT DOCUMENTS

| | | | |
|---|---|---|---|
| 4,486,739 A | 12/1984 | Franaszek et al. | |
| 4,620,311 A | 10/1986 | Schouhamer Immink | |
| 5,305,352 A | 4/1994 | Calderbank et al. | |
| 5,852,634 A | 12/1998 | Marshall | |
| 6,052,411 A | 4/2000 | Mueller et al. | |
| 6,347,122 B1 | 2/2002 | Chen et al. | |
| 6,430,230 B1 * | 8/2002 | Cunningham | H04L 25/4908 375/292 |
| 6,804,805 B2 | 10/2004 | Rub | |
| 6,897,793 B1 | 5/2005 | Kim et al. | |
| 6,956,852 B1 * | 10/2005 | Bechtolsheim | H04L 12/4633 370/389 |
| 7,020,211 B2 * | 3/2006 | Terada | H03M 5/145 375/259 |
| 7,024,653 B1 | 4/2006 | Moore et al. | |
| 7,076,724 B2 | 7/2006 | Cole et al. | |

(Continued)

FOREIGN PATENT DOCUMENTS

| | | |
|---|---|---|
| EP | 1018815 | 7/2000 |
| EP | 1303917 | 4/2003 |

(Continued)

OTHER PUBLICATIONS

Alistair Coles, Overview of the modified 8B10B code scheme, Aug. 1987, Hewlett Packard Laboratories, Bristol, pp. 1 to 15 (retrieved from Google.com Dec. 8, 2015).*

(Continued)

*Primary Examiner* — Shelly A Chase
(74) *Attorney, Agent, or Firm* — Active Knowledge Ltd.

(57) ABSTRACT

Methods and systems for encoding a frame utilizing at least two line-codes having different minimal Hamming distances. The method includes maintaining over the frame absolute value of running disparity lower than or equal to K, while: encoding a first part of the frame utilizing a first line-code having a binary code word length N' and a minimal Hamming distance D'; and encoding a second part of the frame utilizing a second line-code having a binary code word length N" and a minimal Hamming distance D" lower than D'. Where the value of K is lower than both N'/2 and N"/2.

21 Claims, 9 Drawing Sheets

(56) References Cited

U.S. PATENT DOCUMENTS

| | | | |
|---|---|---|---|
| 7,187,307 B1 * | 3/2007 | Schmidt | H04L 1/00 341/50 |
| 7,296,211 B2 | 11/2007 | Cole et al. | |
| 7,477,169 B2 * | 1/2009 | Carter | H04L 5/0092 341/58 |
| 7,599,396 B2 | 10/2009 | Boecker et al. | |
| 7,760,749 B2 | 7/2010 | Wang et al. | |
| 7,778,242 B1 | 8/2010 | Barany et al. | |
| 8,917,194 B2 * | 12/2014 | Whitby-Strevens | 341/50 |
| 2008/0063375 A1 | 3/2008 | Betti et al. | |
| 2008/0101467 A1 | 5/2008 | MacMullan et al. | |
| 2015/0019921 A1 * | 1/2015 | Chen | G06F 11/1048 714/701 |

FOREIGN PATENT DOCUMENTS

| | | | |
|---|---|---|---|
| EP | 1381179 | 1/2004 | |
| WO | WO03069918 | 8/2003 | |
| WO | WO2004/002094 | * 12/2003 | H04L 25/49 |
| WO | WO2009087546 | 7/2009 | |

OTHER PUBLICATIONS

Mowbray et al., New 5B/6T code for data transmission on unshielded twisted pair cable, 1993, IEEE, Electronic Letters vol. 29, Issue 12, pp. 1107-1109.*

Al X. Widmer, Peter A. Franaszek (1983), "A DC-Balanced, Partitioned-Block, 8B/10B Transmission Code", IBM Journal of Research and Development 27 (5): 440.

* cited by examiner

MAINTAINING RUNNING DISPARITY WHILE UTILIZING DIFFERENT LINE-CODES

BACKGROUND

Various communication systems transmit packets from a first node (the transmitting node) to a second node (the receiving node) over a communication channel. The transmitting node typically includes an encoder and a transmitter, and the receiving node typically includes a detector and a decoder. In many communication systems, the packets are encoded utilizing line-codes, which are configured to suit the characteristics of the channel, and facilitate the operation of the detector. For example, line-codes characterized by high transition density facilitate better clock recovery. As another example, line-codes characterized by good DC-balance, usually indicated by low running disparity, are better suitable for communication channels with poor response to DC signals. DC-balanced line-codes also facilitate simpler coupling of the nodes to the communication channel (e.g. AC coupling rather than DC coupling).

The minimum Hamming distance of a line-code determines the error detection and/or correction capability of the code. However, higher minimum Hamming distance implies lower code rate, and therefore selecting a line-code for a given communication system imposes a trade-off between throughput and error resilience.

In many communication systems, idle signals are transmitted during the gaps between packets. Since the idle signals are utilized by the receiving node in order to maintain synchronization, the idle signals are usually configured to comply with the line-code related characteristics, such as running disparity and transition density.

BRIEF SUMMARY

In one embodiment, a communication node including an encoder and a transmitter. The encoder is configured to encode a first part of a frame utilizing a first line-code having a binary code word length N' and a minimal Hamming distance D'. The encoder is further configured to encode a second part of the frame utilizing a second line-code having a binary code word length equal to N" and a minimal Hamming distance D" lower than D'. The encoder is further configured to maintain over the frame absolute value of running disparity lower than or equal to K, wherein K is lower than both N'/2 and N"/2. The transmitter is configured to transmit the encoded frame over a communication channel.

In another embodiment, a communication system including a first node configured to communicate with a second node over a communication channel. The first node includes an encoder and a transmitter. The encoder is configured to encode a first part of a frame utilizing a first line-code having a binary code word length N' and a minimal Hamming distance D'. The encoder is further configured to encode a second part of the frame utilizing a second line-code having a binary code word length equal to N" and a minimal Hamming distance D" lower than D'. The encoder is further configured to maintain over the frame absolute value of running disparity lower than or equal to K, wherein K is lower than both N'/2 and N"/2. The transmitter is configured to transmit the frame over the communication channel. The second node includes a detector and a decoder. The detector is configured to detect the frame, and the decoder is configured to decode the first part, utilizing the first line-code, and to decode the second part, utilizing the second line-code.

In still another embodiment, a method for encoding a frame utilizing at least two line-codes having different minimal Hamming distances includes: maintaining over the frame absolute value of running disparity lower than or equal to K, while: encoding a first part of the frame utilizing a first line-code having a binary code word length N' and a minimal Hamming distance D'; and encoding a second part of the frame utilizing a second line-code having a binary code word length N" and a minimal Hamming distance D" lower than D'. The value of K is lower than both N'/2 and N"/2.

In further another embodiment, a method for encoding a frame includes encoding a header part of the frame utilizing a first code having a minimal Hamming distance D1, and encoding a payload of the frame utilizing a second code having a minimal Hamming distance D2 higher than D1.

BRIEF DESCRIPTION OF THE DRAWINGS

The embodiments are herein described, by way of example only, with reference to the accompanying drawings. In the drawings.

DETAILED DESCRIPTION

Figure 1:
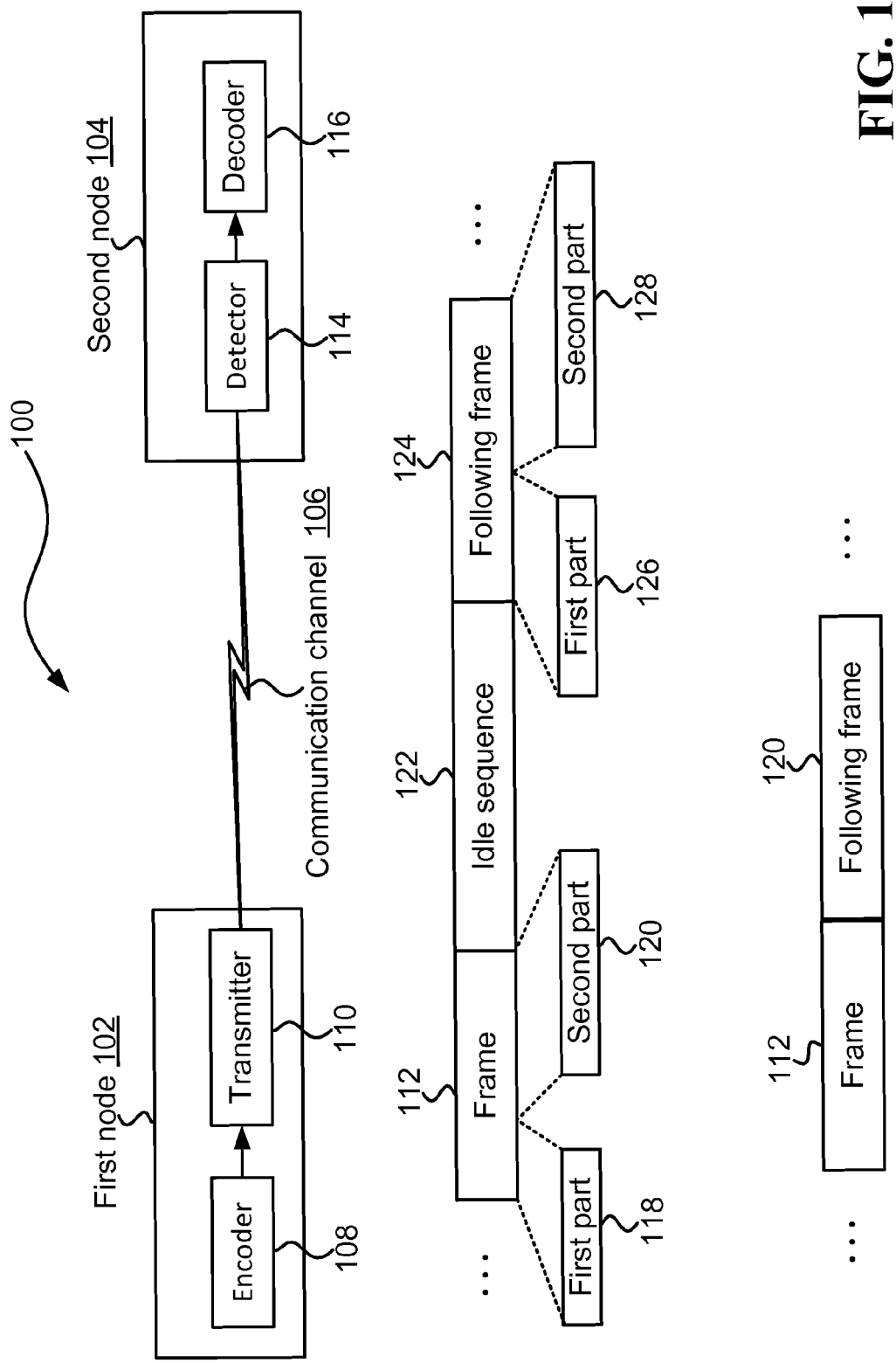
FIG. 1 illustrates one embodiment of a communication system.

FIG. 1 illustrates one embodiment of a communication system 100. The communication system 100 includes a first node 102, which sends one or more frames over a communication channel 106, and a second node 104, which receives the frames. The first node includes an encoder 108, which encodes the frames, and a transmitter 110, which transmits the frames over the communication channel. The second node 104 includes a detector 114, which detects the frames, and a decoder 116, which decodes the frames. The first node sends a frame 112, which includes a first part 118 and a second part 120. The encoder 108 encodes the first and second parts of the frame, utilizing first and second line-codes, respectively, and the decoder 116 decodes the first and second parts of the frame, utilizing the same first and second line-codes, respectively.

A line-code is a binary code, which encodes words of M binary symbols, referred to as input words, to words of N binary symbols, referred to as code words. The two values of the binary symbols are denoted herein as "one" ("1") and "zero" ("0"). M is referred to as the input word length of the line-code, N is referred to as the code word length of the code, and the ratio of M divided by N is referred to as the rate R of the line-code. M is lower than N, and therefore R is less than 1. The output set of a line-code is the set of all code words that may be produced by the line-code, and is therefore a proper subset of the set of all 2N binary words of length N.

The first and second line-codes have input word lengths M' and M", respectively, binary code word lengths N' and N", respectively, and code rates R' and R", respectively. The first and second line-codes have minimum Hamming distances D' and D", respectively, where D" is lower than D'.

In one embodiment, the "running disparity" at a certain binary symbol produced by the encoder is the difference between the number of "ones" and the number of "zeroes" produced by the encoder up to and including the certain symbol.

The encoder 108 maintains the running disparity over the frame 112 bounded by a predetermined value K (i.e., the absolute value of the running disparity over the frame is maintained lower than or equal to K). In one example, K is lower than N'/2. Additionally or alternatively, K may be lower than N"/2.

In one example, the initial value of the running disparity is zero. In another example, the initial value of the running disparity is minus one. In one example, the running disparity is reset to its initial value every predetermined number of frames, which may be unlimited. The running disparity may be calculated at the end of each code word, or at each symbol.

In one example, K is lower than N'/4. Additionally or alternatively, K may be lower than N"/4. In one example, K is lower than 3. In one example, K is lower than 2. The disparity of a code word is the difference between the number of "ones" and the number of "zeroes" within the word. For example, the disparity of the code word 01101100 is zero, the disparity of the code word 01111100 is two, and the disparity of the code word 01001000 is minus four.

In one embodiment, the first and second line-codes facilitate maintaining the running disparity bounded by selecting the disparity of the current code word based on the running disparity at the end of the previous code word. For example, the encoder may select a code word with a zero or negative disparity when the running disparity is positive, and selects a code word with a zero or positive disparity when the running disparity is negative, thereby maintaining the running disparity bounded.

A "paired disparity" line-code is a line-code, where each input word is encoded either to a code word with a zero disparity, or to a code word selected from a set of code words containing at least one code word with a positive disparity and at least one code word with a negative disparity. A "balanced paired disparity" line-codes is a paired disparity line-codes, where each input word is encoded either to a code word with a zero disparity, or to a code word selected from a balanced pair of code words (i.e., a first code word with a positive disparity P, and a second code word with a negative disparity minus P).

In one embodiment, the first and second line-codes are paired disparity line-codes, and code word selection is based on the running disparity (i.e., when the running disparity is positive, the disparity of the next code is either zero or negative, and when the running disparity is negative, the disparity of the next code word is either zero or positive). Thereby, the absolute value of the running disparity is maintained lower than or equal to P, where P is the maximum absolute value of the disparities of all code words in the output set of the line-code. In one embodiment, the first and second line-codes are balanced paired disparity line-codes, and the encoder maintains the running disparity bounded between zero and P (inclusive) by selecting a code word with negative disparity only when the running disparity is positive. Alternatively, the encoder may maintain the running disparity between zero and minus P (inclusive), by selecting a code word with positive disparity only when the running disparity is negative. In one example, P equals 2, and the running disparity is maintained between zero and 2 (inclusive). Alternatively, the running disparity is maintained between zero and minus 2 (inclusive). In one example, the initial value of the running disparity is minus one, and the running disparity is maintained between minus one and plus one.

In one embodiment, the encoder selects the code words of the second part of the frame based on a running disparity, which is calculated from the beginning of the first part of the frame, thereby maintaining the running disparity bounded over the entire frame. The disparity of the first code word of the second frame is selected based on the running disparity calculated at the end of the first part of the frame, although the first and second parts of the frame are encoded with different line-codes. In one example, the first and second line-codes are balanced paired disparity line-codes, both with P equals 2, and the initial value of the running disparity is set to minus one. In this example, the running disparity is maintained between minus one and one (inclusive), and the absolute value of the running disparity is accordingly maintained lower than 2.

In some examples, N' and N" are equal, and therefore the first output set of the first line-code and the second output set of the second line-code are both subsets of the set of all binary words of length N'. Following are some examples regarding the relation between the first and second output sets. In all those examples, N' and N" are equal.

In one example, the first and second output sets are mutually exclusive to each other, i.e., they do not share any common code word. In another example, the first set and second output sets, are not exclusive to each other, i.e., they share at least one common code word.

In one example, the first output set is a subset of a second output set, M' is lower than M", and R' is lower than R". Accordingly, the first and second line-codes provide a trade-off between error resilience and bandwidth efficiency: the first line-code features better error resilience (D' is higher), while the second line-code features better bandwidth efficiency (R' is lower). In this example, the first line code may be utilized when higher error resilience is desired, thereby gaining the higher bandwidth efficiency of the second code whenever lower error resilience can be tolerated.

In one example, the first output set is not a subset of a second output set, i.e. the first output set includes at least one code word exclusive to the second output set.

The 8b/10b is a known family of balanced paired disparity line-codes with M=8, N=10, and P=2. In one example, the first output set is a subset of the output set of an 8b/10b line-code. Additionally or alternatively, the second output set may be a subset of the output set of an 8b/10b line-code.

In one embodiment, the encoder 108 maintains over the frame transition density equal to or better than a predetermined transition density. The predetermined transition density may be at least one transition within any sequence of Z consecutive symbols. Z may equal 6, e.g., when the first and second output sets are subsets of the output set of the data and control words of an 8b/10b line-code. Z may also be lower than 6, e.g., when the first and second output sets are subsets of the output set of the data words of an 8b/10b line-code.

In one embodiment, the encoder 108 maintains over the frame spectral uniformity equal to or better than a predetermined spectral uniformity. The encoder may receive words that are already selected to produce the required spectral uniformity. Additionally or alternatively, the encoder may randomize the stream of input words, thereby maintaining the spectral uniformity of the stream of encoded words.

In one example, the communication channel 106 includes an optical fiber. Additionally or alternatively, the communication channel may include a conductive wire, a wireless channel, and/or any other suitable communication channel.

The second part of different frames may be encoded utilizing different line-codes, e.g. encoding the second part of some frames utilizing the first line-code, and the second part of other frames utilizing the second line-code. The line-code may be selected based on conditions of the communication channel, such as received signal level, received noise level, signal to noise ratio, symbol error rate, and/or any other suitable channel condition. For example, the first line-code may be selected only when its higher error resilience capability is required due to the channel condition (e.g. the symbol error rate is higher than some accepted value). In this example, the system may benefit from the higher bandwidth efficiency of the second line-code whenever allowed by the channel condition.

Additionally or alternatively, the line-code utilized for encoding the second part of the frame may be selected based on the type of the data contained therein. For example, the second part of the frame may be encoded utilizing the first line-code only when its higher error resilience capability is required due to the type of the data (e.g. the data is highly sensitive to errors). In one example, the line-code is selected based on both data type and channel condition.

In one example, the first part of the frame may include a header of the frame, and the second part of the frame may include a payload of the frame. The first part of the frame may include an indication of the line-code utilized for encoding the second part of the frame. Accordingly, the first part of the frame may contain an indication that the second part of the frame is encoded utilizing the second line-code. The decoder 116 may select an appropriate line-code for decoding the second part of the frame based on the indication included in the first part of the frame.

In one embodiment, the encoder 108 produces an idle sequence 122, which resides between the frame 112 and a following frame 124. The idle sequence includes code words of length N_idle, which may optionally be equal to N' or to N". In one example, the second node 104 cannot predict the starting point of the following frame 124, because the length of the idle sequence 122 is unknown. In this example, the detector 114 detects the idle sequence 122, and the decoder 116 identifies the end thereof, thereby determining the starting point of the following frame 124.

In one embodiment, the encoder 108 maintains the absolute value of the running disparity over the idle sequence 122 lower than or equal to K. K may optionally be lower than N_idle/2 or lower than N_idle/4.

In one embodiment, the idle sequence is composed of code words of a fourth line-code. The idle sequence may be produced by encoding a pseudo-random sequence of binary symbols utilizing the fourth line-code. The encoder 108 may select the disparity of the current code word based on the running disparity at the end of the previous code word, as explained above regarding the first and second line-codes.

In one embodiment, the encoder 108 maintains the absolute running disparity over the frame and the idle sequence lower than or equal to K. The encoder 108 may select the disparity of the first code word of the idle sequence based on the running disparity calculated at the end of the frame, although the frame and the idle sequence are encoded with different line codes. In one example, the first, second, and fourth line-codes are balanced paired disparity line-codes with P equals two, the initial value of the running disparity is set to minus one, and the absolute value of the running disparity is maintained lower than 2, although the frame and the idle sequence may be encoded with different line codes.

In one embodiment, the encoder 108 maintains the transition density over the idle sequence equal to or better than the predetermined transition density of at least one transition within any sequence of Z consecutive symbols. In one example, Z equals. In another example, Z is lower than 6.

In one embodiment, the encoder 108 maintains the spectral uniformity over the idle sequence equal to or better than the predetermined spectral uniformity. The spectral uniformity of the idle sequence may result from the distribution of the output set of the fourth line-code, and/or from randomizing the input of the fourth line-code.

In one embodiment, the encoder 108 maintains the running disparity, from the beginning of the frame 112 to the end of the following frame 124, bounded by K (i.e., maintaining the absolute value of the running disparity lower than or equal to K). The running disparity may be maintained bounded over a sequence of the frame 112, the following frame 124, and the idle sequence 122. Additionally or alternatively, the running disparity may be maintained bounded over a sequence of the frame 112 and the following frame 124, with no intermediate idle sequence.

In one embodiment, the following frame is encoded utilizing one or more line-codes, and the encoder 108 selects the code words of the following frame based on a running disparity, which is calculated from the beginning of the frame, thereby maintaining the running disparity bounded by K over the stream of the code words of the frame and the following frame. The disparity of the first code word of the following frame is selected based on the running disparity calculated at the end of the frame, or at the end of the idle sequence, as applicable.

In one embodiment, the following frame 124 includes a first part 126 of the following frame, and a second part 128 of the following frame, and encoder 108 encodes the first and second parts of the following frame utilizing the first line-code and a third line-code, respectively. The third line-code has input word length M''', binary code word lengths N''', and code rate R'''. The third line-code has a minimum Hamming distance D''', where D''' is lower than D''. The encoder 108 maintains the running disparity from the beginning of the frame to the end of the following frame bounded by K (i.e., the absolute value of the running disparity is maintained lower than or equal to K). In one example, the disparity of the first code word of the second part of the following frame is selected based on the running disparity calculated at the end of the first part of the second frame, although the first and the second parts of the following frame are encoded with different line codes. K may be lower than N'''/2 or lower than N'''/4, and N''' may be equal to N'.

When N''' is equal to N', the first output set of the first line-code and the third output set of the third line-code are both subsets of the set of all binary words of length N'. In one example, where N''' is equal to N', the third output set of the third line-code is not a subset of the first output set of the first line-code (i.e., the third output set includes at least one code word exclusive to a first output set).

Figure 2:
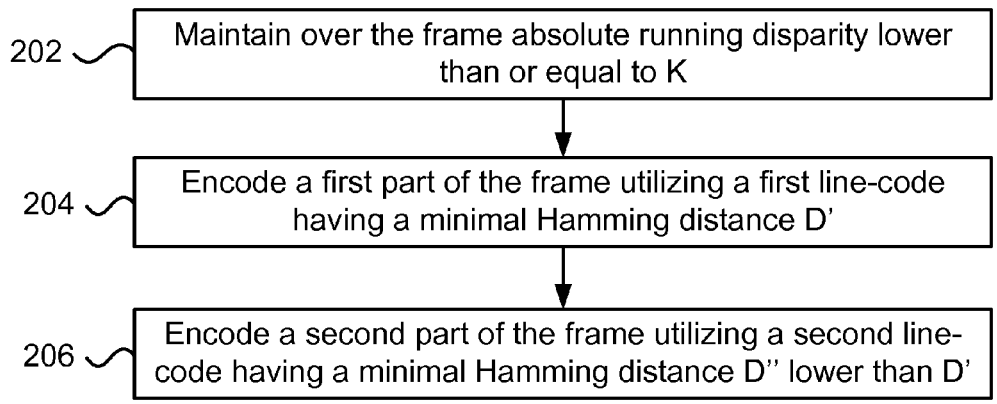
FIG. 2 illustrates one embodiment of a method for encoding a frame.

FIG. 2 illustrates one embodiment of a method for encoding a frame. The method may be performed by a first communication node, such as the first node 102 in FIG. 1, and the frame may be the frame 112 in FIG. 1. In addition, the method may be performed by any other communication node, or by any other suitable device. The method includes at least the following steps: In step 202, maintaining the running disparity over the frame bounded by a predetermined value K (i.e., the absolute value of the running disparity over the frame is maintained lower than or equal to K). In step 204, encoding the first part of the frame utilizing a first line-code. And in step 206, encoding the second part of the frame utilizing a second line-code. The first and second line-codes have code word lengths N' and N", respectively, and minimum Hamming distances D' and D", respectively, where D" is lower than D'. In one example, K is lower than N'/2. Additionally or alternatively, K may be lower than N"/2.

In one example, K is lower than N'/4. Additionally or alternatively, K may be lower than N"/4. In one example, K is lower than 3. In one example, K is lower than 2.

In some examples, N' and N" are equal. Following are some examples regarding the relation between the first and second output sets. In all those examples, N' and N" are equal. In one example, the first and second output sets are mutually exclusive to each other, i.e., they do not share any common code word. In another example, the first set and second output sets, are not exclusive to each other, i.e., they share at least one common code word. In one example, the first output set is a subset of a second output set. In one example, the first output set is not a subset of a second output set, i.e. the first output set includes at least one code word exclusive to the second output set.

In one embodiment, the first output set is a subset of the output set of an 8b/10b line-code. Additionally or alternatively, the second output set may be a subset of the output set of an 8b/10b line-code.

In one embodiment, the method illustrated in FIG. 2 further includes maintaining over the frame transition density equal to or better than a predetermined transition density, which may be at least one transition within any sequence of Z consecutive symbols. In one example, Z equals 6. In one example, Z is lower than 6.

In one embodiment, the method further includes maintaining over the frame spectral uniformity equal to or better than a predetermined spectral uniformity.

In one embodiment, the method optionally includes an additional step of transmitting the frame over a communication channel. The step of transmitting the frame may be performed by a transmitter, such as the transmitter 110 in FIG. 1, or by any other transmitter, or by any other suitable device.

The method may further include an optional step of detecting the frame and a step of decoding thereof, which may be performed by a second communication node, such as the second node 104 in FIG. 1, or by any other communication node.

In one example, the first part of the frame may include the header of the frame, and the second part of the frame may include the payload of the frame. In one example, the second part of different frames may be encoded utilizing different line-codes. The line-code may be may be selected based on the type of the data carried by the certain frame, or by the state of the channel during the transmission of the certain frame, or by some combination thereof, or by any other suitable parameter. The first part of the certain frame may include an indication of the line-code utilized for encoding the second part of the certain frame, in order to facilitate utilization of an appropriate line-code for decoding the second part of the certain frame. Accordingly, the first part of the frame may contain an indication that the second part of the frame is encoded utilizing the second line-code.

In one embodiment, the method illustrated in FIG. 2 may further include an optional step of producing an idle sequence, which may be performed by an encoder, such as the encoder 108 in FIG. 1, or by any other suitable encoder. The idle sequence may be the idle sequence 122 in FIG. 1. The idle sequence includes code words of length N_idle, which may optionally be equal to N' or to N".

Additionally, the method may include an optional step of transmitting the idle sequence over the communication channel, which may be performed by a transmitter, such as the transmitter 110 in FIG. 1, or by any other transmitter, or by any other suitable device. The method may optionally further include a step of detecting the idle sequence, and a step of identifying the end of the idle sequence. The step of detecting the idle sequence may be performed by a detector, such as the detector 114 in FIG. 1, or by any other detector, or by any other suitable device; and the step of identifying the end of the idle sequence may be performed by a decoder, such as the decoder 116 in FIG. 1, or by any other decoder, or by any other suitable device. In one example, identifying of the end of the idle sequence facilitates determining the beginning of the following frame.

In one embodiment, the step of producing an idle sequence further includes maintaining the absolute running disparity over the idle sequence lower than the predetermined value K. In one example, K is lower than N_idle/2. In one example, K is lower than N_idle/4. In one embodiment, the idle sequence is produced of code words of a fourth line-code, e.g., by encoding a pseudo-random sequence of binary symbols utilizing the fourth line-code. In one embodiment, the method illustrated in FIG. 2 further includes maintaining the absolute running disparity over the frame and the idle sequence lower than K. In one embodiment, the step of producing an idle sequence further includes maintaining the transition density over the idle sequence equal to or better than the predetermined transition density. In one embodiment, the step of producing an idle sequence further includes maintaining the spectral uniformity over the idle sequence equal to or better than the predetermined spectral uniformity.

In one embodiment, the method illustrated in FIG. 2 includes an optional step of encoding a following frame, which may be performed by an encoder, such as the encoder 108 in FIG. 1, or by any other encoder, or by any other suitable device. In addition, the following frame may be the following frame 124 in FIG. 1. In one example, the idle sequence 122 resides between the frame 112 and the following frame 124, and the step of encoding a following frame is accordingly performed after the step of producing an idle sequence. Additionally or alternatively, the following frame may adjacent to the frame, without an intermediate idle sequence, and the step of encoding a following frame may accordingly be performed directly after encoding the first frame, without performing the intermediate step of producing an idle sequence.

In one embodiment, the method include an optional step of transmitting the following frame over the communication channel, which may be performed by a transmitter, such as the transmitter 110 in FIG. 1, or by any other transmitter, or by any other suitable device. Additionally, the method may include an optional step of detecting the following frame and an optional step of decoding thereof. The step of detecting the following frame may be performed by a detector, such as the detector 114 in FIG. 1, or by any other detector, or by any other suitable device; and the step of decoding the following frame may be performed by a decoder, such as the decoder 116 in FIG. 1, or by any other decoder, or by any other suitable device.

In one embodiment, the method further includes maintaining the running disparity, from the beginning of the frame to the end of the following frame, bounded by K (i.e., maintaining the absolute value of the running disparity lower than or equal to K). The running disparity is maintained bounded over a sequence including the frame and the following frame, with or without intermediate idle sequence.

In one embodiment, the following frame includes first and second parts of the following frame, and the step of encoding the following frame includes a step of encoding the first part of the following frame utilizing the first line-code, and a step of encoding the second part of the following frame utilizing a third line-code. The third line-code has binary code word lengths N''' and a minimum Hamming distance D''', where D''' is lower than D''. The method may further include maintaining the running disparity from the beginning of the frame to the end of the following frame bounded by K (i.e., maintaining the absolute value of the running disparity lower than or equal to K). In one example, K is lower than N'''/2. In one example, K is lower than N'''/4.

N''' may be equal to N'. In one example, in which N' and N''' are equal, the third output set of the third line-code is not a subset of the first output set of the first line-code (i.e., the third output set includes at least one code word exclusive to a first output set).

Figure 3:
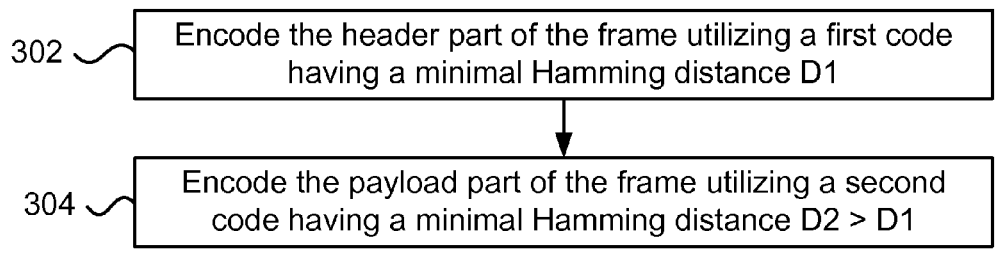
FIG. 3 illustrates one embodiment of a method for encoding a frame having a header part and a payload part.

FIG. 3 illustrates one embodiment of a method for encoding a frame having a header part and a payload part. The method illustrated in FIG. 3 includes at least the following steps: In step 302, encoding the header part utilizing a first code having a minimal Hamming distance D1. And in step 304, encoding the payload part utilizing a second code having a minimal Hamming distance D2 higher than D1.

In one embodiment, the method further includes a step of transmitting the frame over a binary channel. In one embodiment, the first and second codes are first and second line-codes having binary code word lengths N1 and N2, respectively, and the method further includes maintaining the running disparity over the frame bounded by K (i.e., maintaining the absolute value of the running disparity lower than or equal to K). In one example, K is lower than N1/2. Additionally or alternatively, in one example, K is lower than N2/2. In one example, N2 equals N1.

Figure 4:
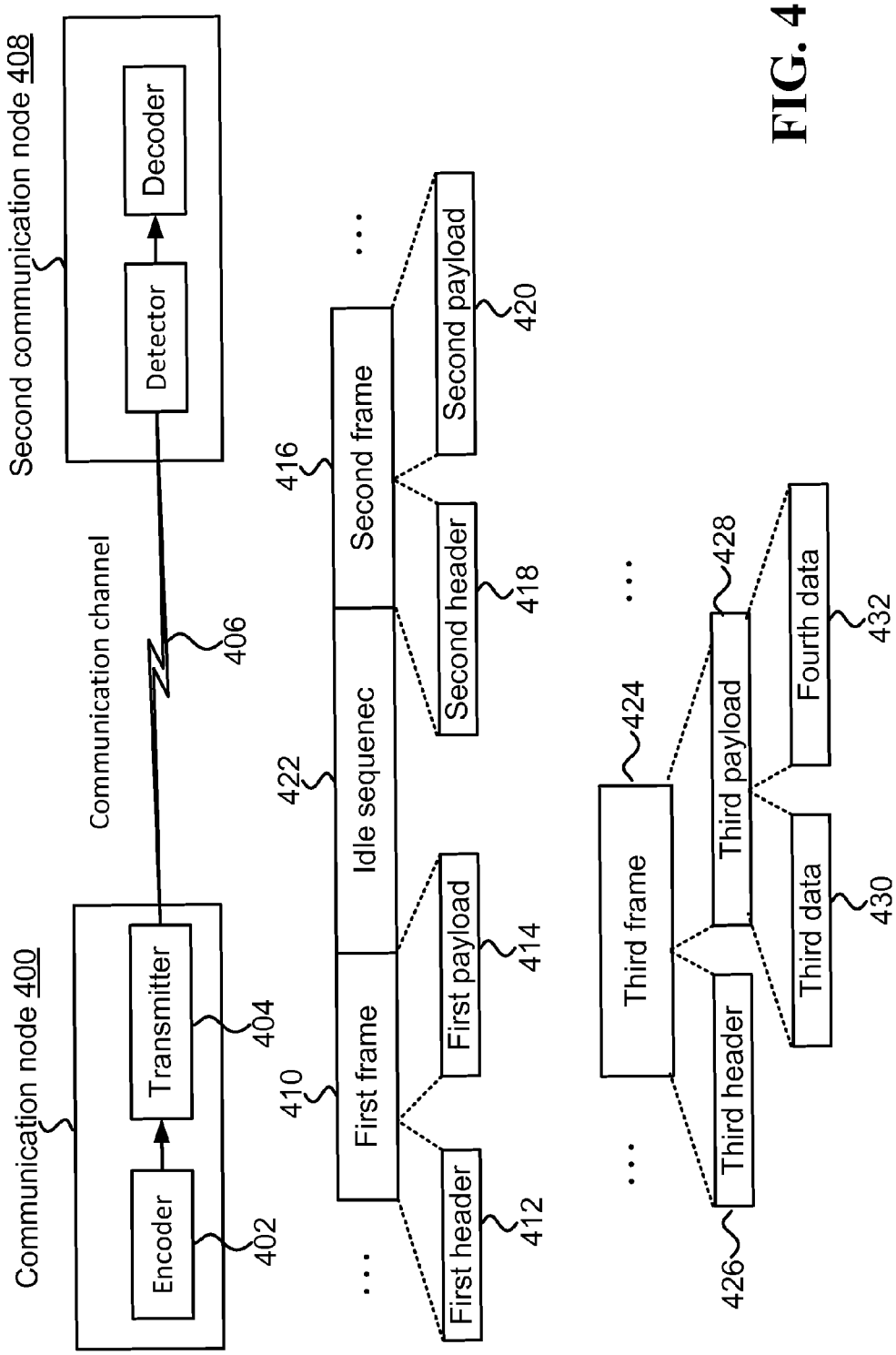
FIG. 4 illustrates one embodiment of a communication node.

FIG. 4 illustrates one embodiment of a communication node 400. The communication node 400 may be the first node 102 of FIG. 1. The communication node 400 includes an encoder 402 encoding frames utilizing two or more line-codes, and a transmitter 404 transmitting the frames over a communication channel 406. The frames are received by a second communication node 408. In one embodiment, each frame includes a header and a payload.

In one embodiment, encoder 402 encodes the payloads of different frames utilizing different line-codes selected from the set of two or more line-codes, while the headers of the frames are encoded utilizing the same line-code, referred to as the first line-code. In one embodiment, a payload of a certain frame is encoded utilizing a line-code selected based on the type of the data within the payload of the certain frame. In one embodiment, the header of the certain frame includes an indication of the line-code utilized for encoding the payload of the certain frame, thereby facilitating the second communication node 408 to decode the payload of the certain frame utilizing the respective line-code.

In one example, the set of two or more line-codes include the first line-code and a second line-code, having input word lengths M' and M'', respectively, binary code word lengths N' and N'', respectively, and code rates R' and R'', respectively. The first and second line-codes have minimum Hamming distances D' and D'', respectively, where D'' is lower than D'.

In one example, the encoder 402 encodes a first frame 410, which includes a first header 412 and a first payload 414, and a second frames 416, which includes a second header 418 and a second payload 420. The encoder 402 encodes the first and second header utilizing the first line-code, and the first and second payloads utilizing the first and second line-codes, respectively.

In one example, the first line-code is selected for encoding the first payload based on a first data type of a first data included in the first payload, and the second line-code is selected for encoding the second payload based on a second data type of a second data included in the second payload.

In one example, the selection of a line-code for encoding the payload of a certain frame may be based only on the respective data type of the data included therein. In another example, line-code selection may be further based on other applicable criteria, such as a criterion based on the condition of the communication channel, or any other suitable criterion. The applicable criteria may be based on channel condition such as signal to noise ratio, symbol error rate, and/or any other suitable channel condition. However, in both examples the selection is affected by the respective data type.

In one example, the communication channel 406 is characterized by first and second channel conditions, which are respectively associated with the transmission of the first and second frames. In this example, the first and second line-codes may be selected for encoding the first and second payloads, respectively, although the differences between the first and second channel conditions are not enough for implying selection of different line-codes.

In one embodiment, the encoder 402 maintains the absolute value of the running disparity, form the beginning of the first frame to the end of the second frame, lower than or equal to a predetermined value K. In one example, K is lower than N'/2. Additionally or alternatively, in one example K is lower than N''/2.

In one example, K is lower than N'/4. Additionally or alternatively, K may be lower than N''/4. In one example, K is lower than 3. In one example, K is lower than 2.

In some examples, N' and N'' are equal. Following are some examples regarding the relation between the first and second output sets. In all those examples, N' and N'' are equal. In one example, the first and second output sets are mutually exclusive to each other, i.e., they do not share any common code word. In another example, the first set and second output sets, are not exclusive to each other, i.e., they share at least one common code word. In one example, the first output set is a subset of a second output set. In one example, the first output set is not a subset of a second output set.

In one embodiment, the first output set is a subset of the output set of an 8b/10b line-code. Additionally or alternatively, the second output set may be a subset of the output set of an 8b/10b line-code.

In one embodiment, the encoder 402 maintains, from the beginning of the frame to the end of the second frame, transition density equal to or better than a predetermined transition density, which is at least one transition within any sequence of Z consecutive symbols. In one example, Z equals 6. In one example, Z is lower than 6. In one embodiment, the encoder 402 maintains, from the beginning of the frame to the end of the second frame, spectral uniformity equal to or better than a predetermined spectral uniformity.

In one example, the communication channel 406 includes an optical fiber. Additionally or alternatively, the communication channel may include a conductive wire, a wireless channel, and/or any other suitable communication channel. In one example, the first header includes an indication that the first payload is encoded utilizing the first line-code, and the second header includes an indication that the second payload is encoded utilizing the second line-code.

In one embodiment, the encoder 402 produces an idle sequence 422, which resides between the first frame 410 and a second frame 416, and includes code words of length N_idle. In one example, N_idle may be equal to N'. Additionally or alternatively, N_idle may be equal to N".

In one embodiment, the encoder 402 maintains the absolute value of the running disparity, over the first frame, the idle sequence, and the second frame, lower than or equal to K. K may optionally be lower than N_idle/2, or lower than N_idle/4.

In one embodiment, the encoder 402 maintains the transition density, over the first frame, the idle sequence, and the second frame, equal to or better than the predetermined transition density. In one embodiment, the encoder 420 maintains the spectral uniformity over the first frame, the idle sequence, and the second frame, equal to or better than the predetermined spectral uniformity.

In one example, the set of two or more line-codes further includes a third line-code having input word length M''', binary code word length N''', code rate R''', and minimum Hamming distance D''', which is different from D".

In one example, the encoder 402 encodes a third frame 424 including a third header 426, and third payload 428, and the third payload 428 includes a third data 430 having a third data type, and a fourth data 432 having a fourth data type. Encoder 402 encodes the third header 426, the third data 430, and the forth data 432, utilizing the first, second and third line-codes, respectively, which are selected for encoding the third data 430 and the fourth data 432, respectively, based on a third and fourth data types, respectively.

In one example, D''' is lower than D", and R''' is higher than R". In this example the fourth data features higher bandwidth efficiency (R'''>R") but lower error resilience (D'''>D") than the third data. In another example the third line-code coincides with the first line-code, and D''' is equal to D'.

Figure 5:
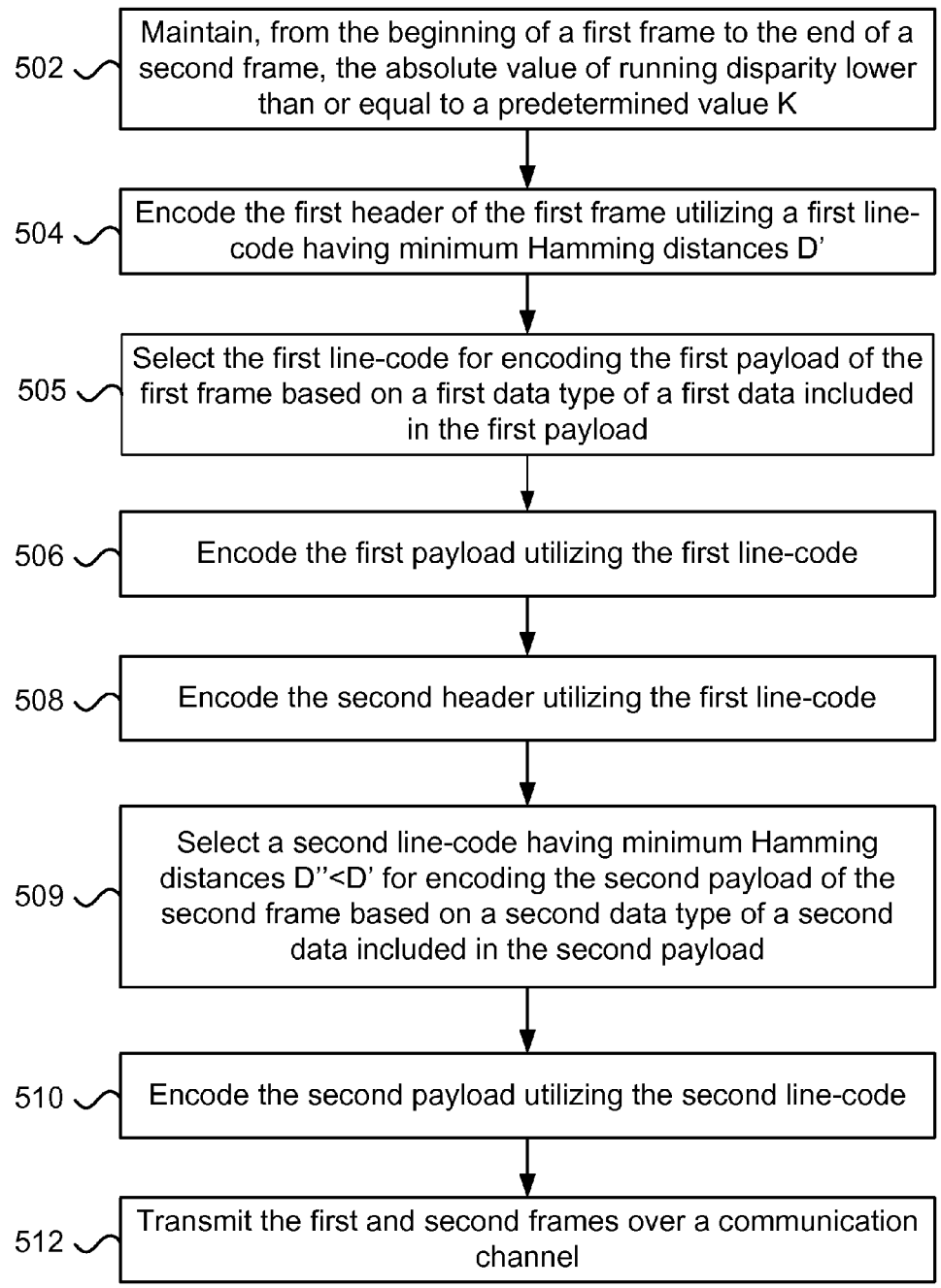
FIG. 5 illustrates one embodiment of a method for encoding frames utilizing line-codes having different minimum Hamming distances.

FIG. 5 illustrates one embodiment of a method for encoding frames utilizing line-codes having different minimum Hamming distances. The method illustrated in FIG. 5 involves encoding at least first and second frames, utilizing at least first and second line-codes, and transmitting the frames over a communication channel. The method may be performed by a communication node such as the communication node 400 in FIG. 4, or by other communication node, or by any other suitable device. In one example, the first and second frames include first and second headers, respectively, and first and second payloads, respectively. The first and second frames may be the first and second frames 410 and 416 in FIG. 4. The frames may be received by a second communication node, such as the second communication node 408 in FIG. 4, or any other suitable device. The first and second line-codes have binary code word lengths N' and N", respectively, and minimum Hamming distances D' and D", respectively, where D" is lower than D'.

In one embodiment, the method illustrated in FIG. 5 includes at least the following steps: In a step 502, maintaining, from the beginning of the first frame to the end of a second frame, the absolute value of running disparity lower than or equal to a predetermined value K. In one example, K is lower than N'/2. Additionally or alternatively, K may be lower than N"/2. In step 504, encoding the first header utilizing the first line-code. In step 505, selecting the first line-code for encoding the first payload based on a first data type of a first data included in the first payload. In step 506, encoding the first payload utilizing the first line-code. In step 508, encoding the second header utilizing the first line-code. In step 509, selecting the second line-code for encoding the second payload based on a second data type of a second data included in the second payload. In step 510, encoding the second payload utilizing the second line-code. And in step 512, transmitting the first and second frames over the communication channel.

In one example, the communication channel is characterized by first and second channel conditions, which are respectively associated with the transmission of the first and second frames. In this example, the first and second line-codes are selected for encoding the first and second payloads, respectively, although the differences between the first and second channel conditions are not enough for implying selection of different line-codes.

In one example, K is lower than N'/4. Additionally or alternatively, K may be lower than N"/4. K may optionally be is lower than 3, or lower than 2. In some examples, N' and N" are equal. Following are some examples regarding the relation between the first and second output sets. In all those examples, N' and N" are equal. In one example, the first and second output sets are mutually exclusive to each other, i.e., they do not share any common code word. In another example, the first set and second output sets, are not exclusive to each other, i.e., they share at least one common code word. In one example, the first output set is a subset of a second output set. In one example, the first output set is not a subset of a second output set. In one example, the first output set is a subset of the output set of an 8b/10b line-code. Additionally or alternatively, the second output set may be a subset of the output set of an 8b/10b line-code.

In one embodiment, the method illustrated in FIG. 5 further includes maintaining, from the beginning of the frame to the end of the second frame, transition density equal to or better than a predetermined transition density, which is at least one transition within any sequence of Z consecutive symbols. In one example, Z equals 6. In one example, Z is lower than 6.

In one embodiment, the method further includes maintaining, from the beginning of the frame to the end of the second frame, spectral uniformity equal to or better than a predetermined spectral uniformity.

In one example, the communication channel includes an optical fiber. Additionally or alternatively, the communication channel may include a conductive wire, a wireless channel, and/or any other suitable communication channel.

In one example, the first header includes an indication that the first payload is encoded utilizing the first line-code, and the second header includes an indication that the second payload is encoded utilizing the second line-code.

The method illustrated in FIG. 5 may further include an optional step of producing an idle sequence, which may be performed by an encoder, such as the encoder 402 in FIG. 4, or by any other suitable encoder. The idle sequence may be the idle sequence 422 in FIG. 4. The idle sequence includes code words of length N_idle, which may optionally be equal to N' or to N".

In one embodiment, the method further involves maintaining the absolute value of the running disparity, over the first frame, the idle sequence, and the second frame, lower than or equal to K. K may optionally be lower than N_idle/2, or lower than N_idle/4.

In one embodiment, the method further involves maintaining the transition density, over the first frame, the idle sequence, and the second frame, equal to or better than the predetermined transition density.

In one embodiment, the method further involves maintaining the spectral uniformity over the first frame, the idle sequence, and the second frame, equal to or better than the predetermined spectral uniformity.

In one example, the set of two or more line-codes further includes a third line-code having input word length M''', binary code word length N''', code rate R''', and minimum Hamming distance D''', which is different from D''.

In one example, the method illustrated in FIG. 5 may further include an optional step of encoding a third frame including a third header and third payload. The step of encoding the third frame may be performed by an encoder, such as the encoder 402 in FIG. 4, or by any other encoder, or by any other suitable device. In addition, the third frame may be the third frame 428 in FIG. 4. The third payload includes a third data and a fourth data, having third and fourth data types, respectively. The third header is encoded utilizing the first line-code, and the third and fourth data are encoded utilizing the second and third line-codes, respectively, which are selected based on a third and fourth data types, respectively. In one example, D''' is lower than D''. In another example the third line-code coincides with the first line-code, and D''' is equal to D'.

Figure 6:
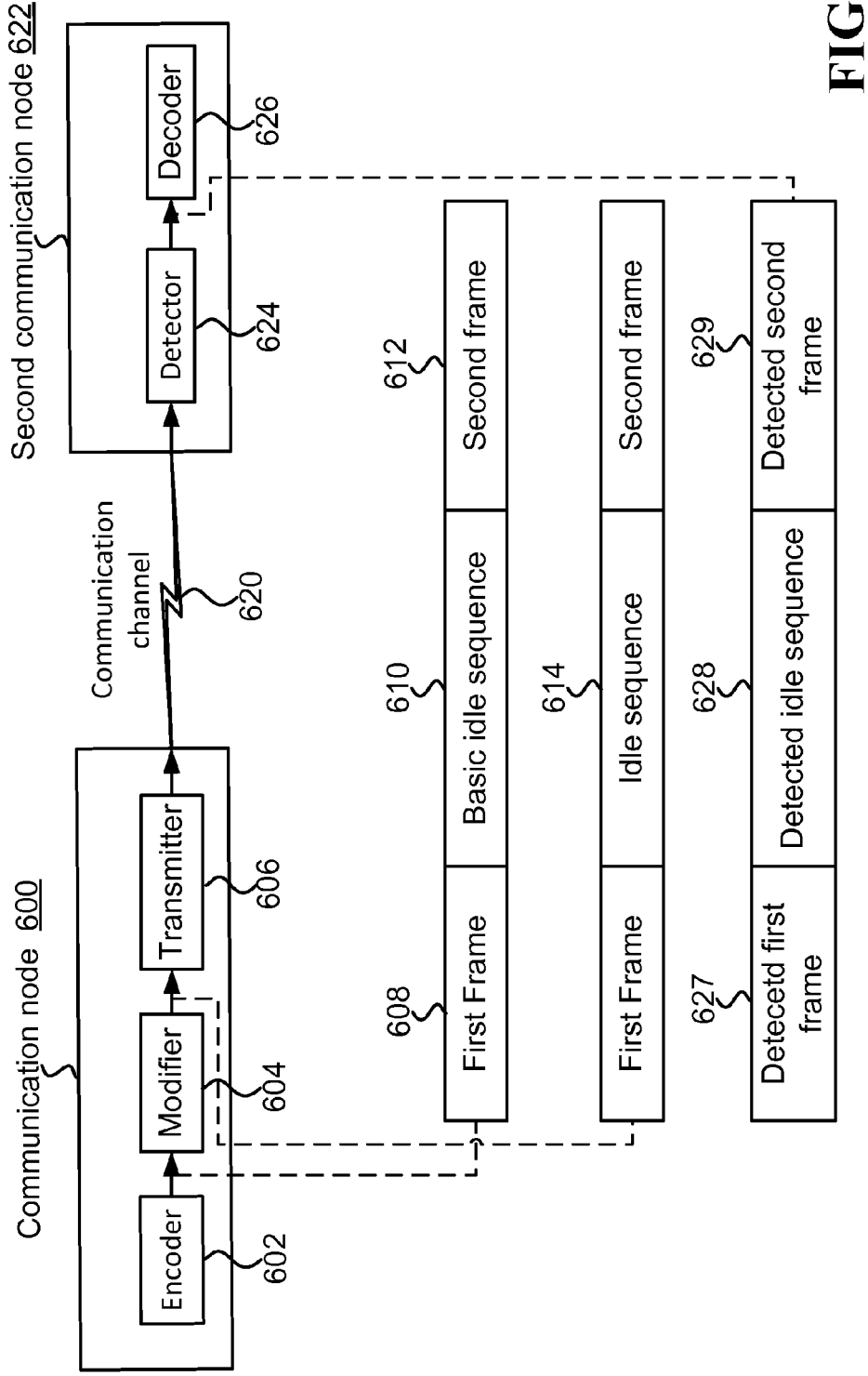
FIG. 6 illustrates one embodiment of a communication node.

FIG. 6 illustrates one embodiment of a communication node 600. The communication node 600 may be the first node 102 in FIG. 1, or the communication node 400 in FIG. 4, or any other suitable communication node. The communication node 600 includes at least an encoder 602 and an idle sequence modifier 604. The communication node 600 may further include a transmitter 606.

The encoder 602 encodes a first frame 608, a basic idle sequence 610, and a second frame 612. The first frame 608, the basic idle sequence 610, and the second frame 612 include code words, and the length of the idle sequence (measured in words) is denoted by X. The code words may include binary symbols, i.e. symbols belonging to an alphabet consisting of two values. Alternatively, the symbols may belong to a non-binary alphabet, i.e. an alphabet consisting of more than two values.

The idle sequence modifier 604 modifies the basic idle sequence 610 into an idle sequence 614, by replacing M certain code words out of the X code words of the basic idle sequence with M alternative code words. The M alternative code words are not unique, i.e., each alternative code word belongs to the same output set as the code words of the idle sequence. Therefore, in one example, each alternative code word is equal to at least one code word of the idle sequence.

In one example, the first frame 608, the idle sequence 614, and the second frame 612 are transmitted by the transmitter 606 over a communication channel 620, and received by a second communication node 622, which includes a detector 624 and a decoder 626. The detector produces a detected first frame 627, a detected idle sequence 628, and a detected second frame 629, also referred to as the received firsts frame, the received idle sequence, and the received second frame. The code words of the detected first frame, the detected idle sequence, and the detected second frame may include one or more erroneous detected symbols, i.e. detected symbols that are different from the respective transmitted symbols. The erroneous symbols are referred to as channel errors.

In one example, the second communication node 622 does not know in advance the length X of the idle sequence, and therefore the decoder 624 does not know in advance the starting point of the detected second frame 629. Furthermore, the decoder 624 is unable to determine the starting point of the detected second frame 629 by inspecting the detected idle sequence 628 per se, since the idle sequence by itself does not indicate its end.

The code words of the basic idle sequence 610 are known in advance to the second communication node 622. For example, the encoder 602 may produce the basic idle sequence utilizing a certain algorithm (e.g. a pseudo random symbol generator) and certain one or more parameters thereof (e.g. initial state of the generator), and the second communication node may produce an identical replica of the basic idle sequence by utilizing the same certain algorithm and the same certain one or more parameters thereof.

The decoder 624 compares the detected idle sequence 628 with a replica of the basic idle sequence 610, and determines the differences between respective code words of the two sequences, which are referred to as the detected differences. In case of no channel errors, the detected differences are identical to the differences between the code words of the basic idle sequence 610 and the respective code words of the idle sequence 614, the latter differences being accordingly referred to as the error-free differences. As explained above, the error-free differences include X−M zero words, and M non-zero words.

A sub-sequence of the error-free differences, which includes the M non-zero words, is referred to as the synchronization sequence. The synchronization sequence is located at a predetermined distance from the end of the idle sequence 614, and the end of the detected idle sequence 628 may be determined by determining the presence of the synchronization sequence.

In one example, M equals one, and the synchronization sequence is a single non-zero word located at a predetermined distance from the end of the idle sequence, for example at the end of the idle sequence. In another example, M is higher than one, and the M non-zero code words are located at predetermined distances from the end of the idle sequence. The M non-zero code words may be consecutive, or not consecutive.

The idle sequence modifier 604 determines the value of each alternative code word to be different from the value of the respective certain code word within the basic idle sequence 610, thereby resulting in the M non-zero words of the synchronization sequence. In one example, the idle sequence modifier 604 determines the value of each alternative code word based only on the value of the respective basic code word appearing in the basic idle sequence 610, thereby resulting in a deterministic synchronization sequence. In another example, the idle sequence modifier 604 may determine the value of each alternative code word based also on other considerations, thereby resulting in different synchronization sequences. The other consideration may be, for example, line-code related considerations, such as running disparity.

The detected sequence of differences may include channel errors. However, in one example, the synchronization sequence facilitates detection thereof also in presence of channel errors, as long as the number of channel errors does not exceed a predetermined threshold.

The difference between the idle sequence and the basic idle sequence may be measured using Hamming distance. When the number of alternative code words is one, the decoder decides between to hypotheses: a first hypothesis that the received word represents an original code word of the basic idle sequence, and a second hypothesis that the received word represents an alternative code word. In this example, T is equal to the integer part of (D_idle 1)/2, where D_idle is the Hamming distance between the two hypotheses, i.e., the distance between the alternative code word and the respective code word in the basic idle sequence.

In one example, D_idle is equal to or higher than 3. In one example, the code words of the idle sequence have code word length N_idle, and D_idle is higher than or equal to N_idle/2. In one example, at least N_idle 1 symbols, out of the N_idle symbols of the alternative code word, are different from the respective symbols of the certain code word. In this example, D_idle is higher than or equal to N_idle 1. In one example, all N_idle symbols of the alternative code word are different from the respective symbols of the certain code word. In this example, D_idle equals N_idle.

In one example, the communication channel 606 includes an optical fiber. Additionally or alternatively, the communication channel may include a conductive wire, a wireless channel, and/or any other suitable communication channel.

In one embodiment, the encoder 602 maintains over the idle sequence 614 an absolute running disparity lower than or equal to K, which is lower than N_idle/2. In one example, K is lower than N_idle/4. In one example, K is lower than 3. In one example, K is lower than 2.

In one example, the first output set of the first line-code is a subset of the output set of all code words produced by an 8b/10b line-code. In this example, each code word of the basic idle sequence is included within an output set of all code words produced by an 8b/10b line-code. In one example, the alternative code words are also included within the first output set, and therefore each code word of the idle sequence is included within the output set output set of all code words produced by an 8b/10b line-code. In one example, the first line-code is an 8b/10b line-code.

Figure 7:
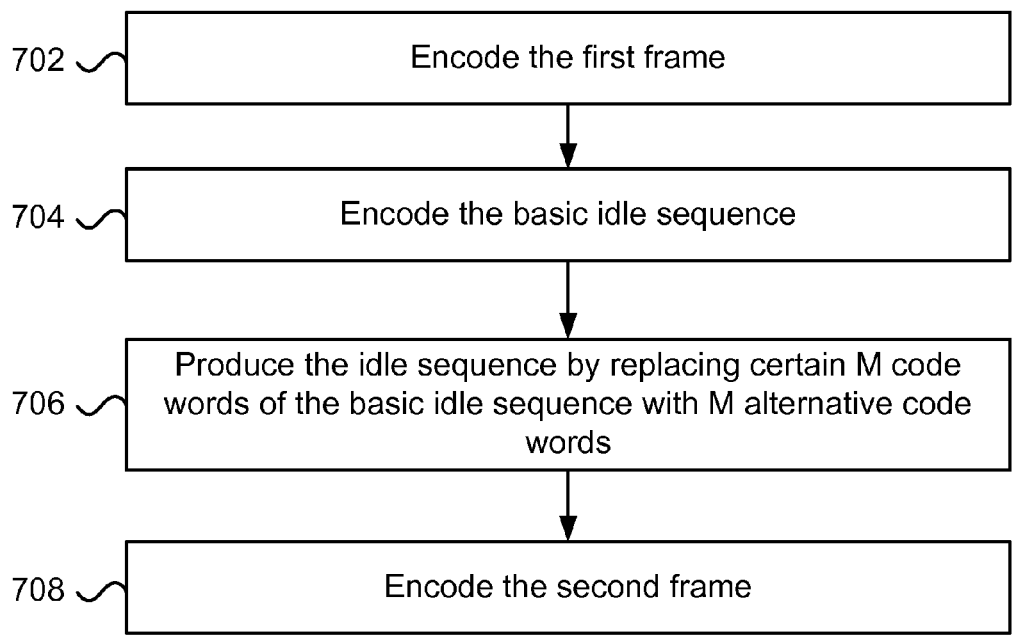
FIG. 7 illustrates one embodiment of a method for indicating the end of an idle sequence.

FIG. 7 illustrates one embodiment of a method for indicating the end of an idle sequence. The method illustrated in FIG. 7 may be performed by the first communication node 600 in FIG. 6. In addition, the method may be performed by any other communication node, or by any other suitable device. The method includes at least the following steps:

In step 702, encoding a first frame. Step 702 may be performed by the encoder 602 in FIG. 6, or by any other suitable encoder. Additionally, the first frame may be the first frame 608 in FIG. 6.

In step 704, encoding a basic idle sequence, which includes code words. Step 704 may be performed by the encoder 602 in FIG. 6, or by any other suitable encoder. Additionally, the basic idle sequence may be the basic idle sequence 610 in FIG. 6.

In step 706, producing an idle sequence by replacing certain M code words of the idle sequence with M alternative code words. Step 706 may be performed by the idle sequence modifier 604 in FIG. 6, or by any other suitable device. Additionally, the idle sequence may be the idle sequence 614 in FIG. 6. The M alternative code words belong to the same output set as the code words of the idle sequence.

And in step 710, encoding a second frame. Step 710 may be performed by the encoder 602 in FIG. 6, or by any other suitable encoder. Additionally, the second frame may be the second frame 612 in FIG. 6.

The method illustrated in FIG. 7 may further includes an optional step of transmitting the first frame, the idle sequence, and the second frame over a communication channel, which may be performed by the transmitter 608 in FIG. 6, or by any other suitable transmitter. Furthermore, the communication channel may be the communication channel 620 in FIG. 6, or any other suitable communication channel. The first frame, the idle sequence, and the second frame may be detected and decoded by a second communication node. The code words of the detected idle sequence may include one or more channel errors.

In one example, the second communication node is unable to determine the starting point of the detected second frame by inspection the detected idle sequence per se, because the second communication node does not know in advance the length of the idle sequence, and the idle sequence by itself does not indicate its end.

In one embodiment, the code words of the basic idle sequence are known in advance to the second communication node, which compares the received idle sequence with a replica of the basic idle sequence. Based on the sequence of differences between the received idle sequence and replica of the basic idle sequence, the second communication node determines the end of the detected idle sequence, thereby determining the starting point of the detected second frame. Furthermore, the second communication node should be able to determine the end of the detected idle sequence correctly, as long as the number of channel errors does not exceed a predetermined threshold.

In one example, the difference between the idle sequence and the basic idle sequence is measured using Hamming distance. When the idle sequence include a single alternative code word, T is equal to the integer part of (D_idle 1)/2, where D_idle is the Hamming distance between the alternative code word and the respective code word in the basic idle sequence. In this example, the second communication node is able to determine the end of the detected idle as long as the number of channel errors within the detected idle sequence is lower than D_idle/2.

In one example, D is equal to or higher than 3. In one example, the code words of the idle sequence have code word length N_idle, and D is higher than or equal to N_idle/2. In one example, D_idle is higher than or equal to N_idle−1. In one example, D_idle equals N_idle.

In one embodiment, the method further includes maintaining over the idle sequence an absolute running disparity lower than or equal to K, which is lower than N_idle/2.

K may optionally be lower than N_idle/4, lower than 3, or lower than 2.

In one example, each code word of the basic idle sequence is included within an output set consisting of all code words produced by an 8b/10b line code. In one example, each code word of the idle sequence is included within the output set output set of all code words produced by an 8b/10b line code.

In one embodiment, the step 704 of encoding the basic idle sequence further includes maintaining over the basic idle sequence transition density equal to or better than a predetermined transition density. In one example, the predetermined transition density is at least one transition within any sequence of 6 consecutive symbols. In one embodiment, the step 706 of producing the idle sequence further includes maintaining over the idle sequence 614 transition density equal to or better than the predetermined transition density.

In one embodiment, the step 704 of encoding the basic idle sequence further includes maintaining over the frame spectral uniformity equal to or better than a predetermined spectral uniformity.

Figure 8:
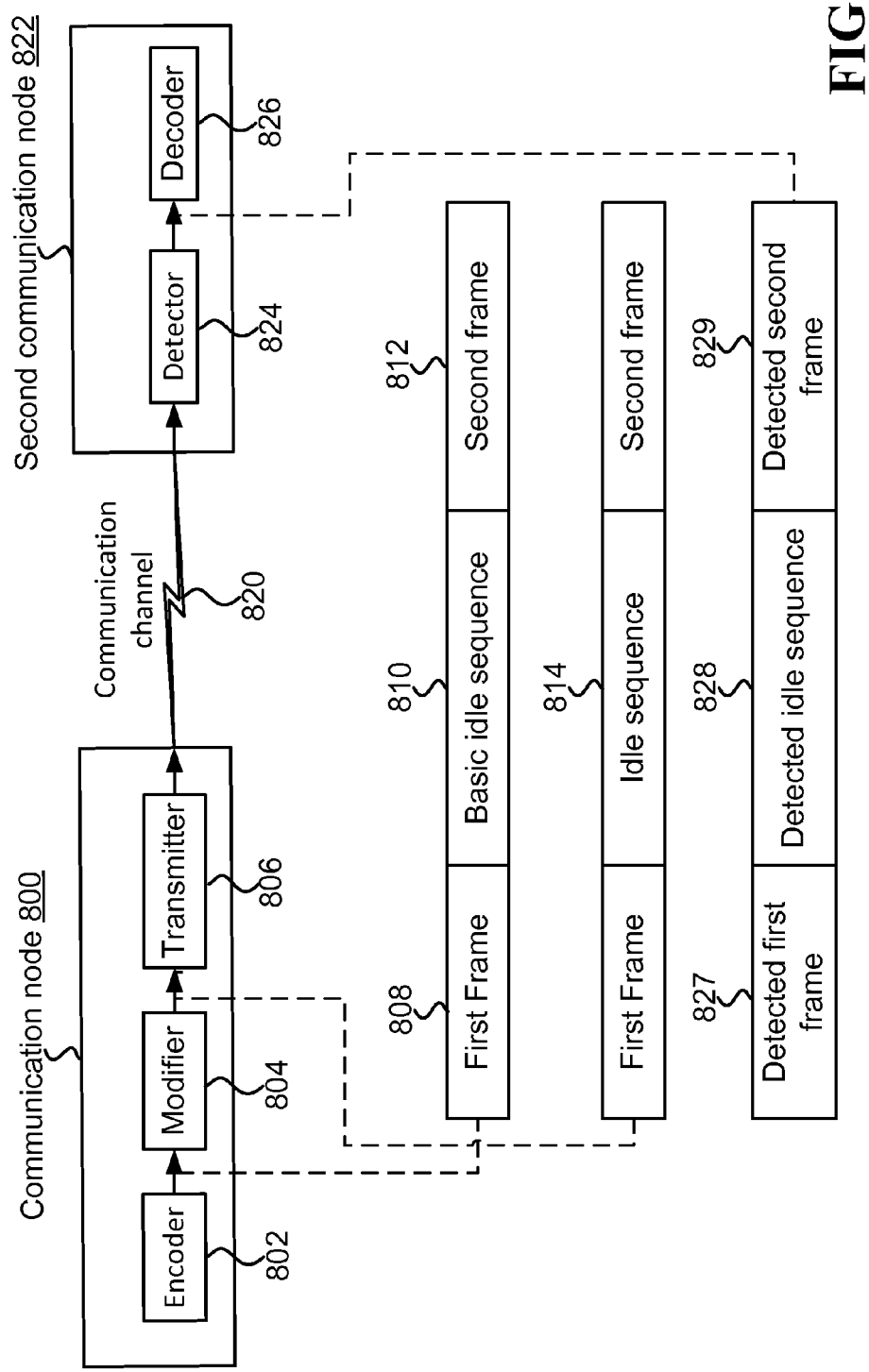
FIG. 8 illustrates one embodiment of a communication node.

FIG. 8 illustrates one embodiment of a communication node 800. The communication node 800 may be the first node 102 in FIG. 1, the communication node 400 in FIG. 4, or any other suitable communication node. The communication node 800 includes at least an encoder 802 and an idle sequence modifier 804. In one embodiment, the communication node 600 further includes a transmitter 806.

In one example, the encoder 802 encodes a first frame 808, a basic idle sequence 810, and a second frame 812. The first frame 808, the basic idle sequence 810, and the second frame 812 include symbols. In one example, the symbols are binary symbols, i.e. symbols belonging to an alphabet consisting of two values. Alternatively, the symbols may belong to a non-binary alphabet, i.e. an alphabet consisting of more than two values.

In one embodiment, the idle sequence modifier 804 modifies the basic idle sequence 810 into an idle sequence 814, by replacing M certain symbols of the basic idle sequence with M alternative symbols. The M alternative symbols belong to the same alphabet as the symbols of the idle sequence. Therefore, in one example, each alternative symbol is equal to at least one symbol of the idle sequence.

In one example, the first frame 808, the idle sequence 814, and the second frame 812 are transmitted by the transmitter 806 over a communication channel 820, and received by a second communication node 822, which includes a detector 824 and a decoder 826. The detector produces a detected first frame 827, a detected idle sequence 828, and a detected second frame 829, also referred to as the received first frame, the received idle sequence, and the received second frame, respectively. In one example, the detected first frame, the detected idle sequence, and the detected second frame may include one or more channel errors.

In one example, the decoder 824 is unable to determine the starting point of the detected second frame 829 by inspection the detected idle sequence 828 per se, because the second communication node 822 does not know in advance the length of the idle sequence, and the idle sequence by itself does not include an indication of its end.

In one embodiment, the symbols of the basic idle sequence are known in advance to the second communication node 822, and the decoder 824 compares the received idle sequence with a replica of the basic idle sequence. The sequence of differences between the received idle sequence and the basic idle sequence is referred to as the detected sequence of differences. The differences may be represented in binary symbols, where zero indicates no difference between the two symbols being compared. The decoder 824 correlates the detected sequence of differences with a synchronization sequence, which represents the difference between the basic idle sequence and the idle sequence. Based on the correlation, the second communication node determines the end of the detected idle sequence, thereby determining the starting point of the detected second frame.

In one example, the synchronization sequence is a Barker sequence of length 13. The weight (i.e. number of non-zero symbols) of this synchronization sequence is 9, and its maximum side-lobe is one. Therefore, in this example, T is equal to 3.

In one embodiment, the difference between the received idle sequence and the basic idle sequence is determined by a detector configured to identify a synchronization sequence. In one example, the difference is a single symbol and deterministic, therefore the detector compares the symbol with the basic idle sequence. In another example, the difference is not deterministic, and the operation of the encoder is reconstructed in the receiver, which checks whether the hypothesis that the idle sequence ends at a certain symbol is correct, or the hypothesis that the idle sequence does not end at the certain symbol is correct.

Figure 9:
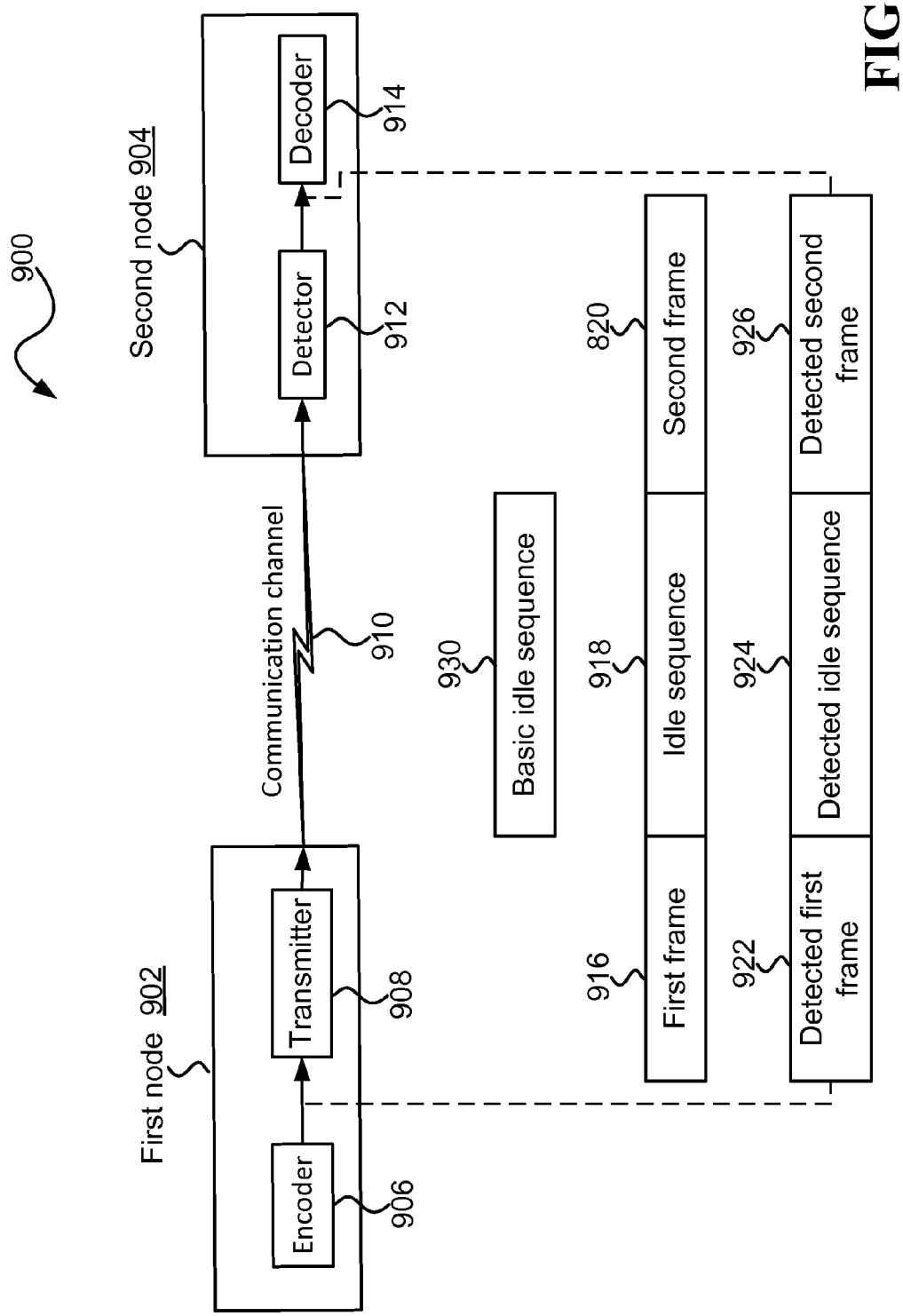
FIG. 9 illustrates one embodiment of a communication system.

FIG. 9 illustrates one embodiment of a communication system 900. The communication system 900 may be the communication system 100 in FIG. 1, or any other suitable communication system. The communication system 900 includes at least a first node 902 and a second node 904. In embodiment, the first node 902 includes an encoder 906 and a transmitter 908. In one example, the first node 902 communicates with the second node 904 over a communication channel 910. The second node may include a detector 912 and a decoder 914.

In one example, the encoder 906 encodes a first frame 916, an idle sequence 918, and a second frame 920, utilizing one or more line-codes, and the transmitter 908 transmits them over the communication channel 910. The first frame 916, idle sequence 918, and second frame 920 may be the frame 112, idle sequence 122, and following frame 124, respectively, in FIG. 1. The first frame, idle sequence, and second frame may be received (detected) by the detector 912 and decoded by the decoder 914, and the received first frame 922, received idle sequence 924, and received second frame 926 may include channel errors. In one example, the length X of the idle sequence is not known in advance to the second node 914.

In one example, the idle sequence 918 is based on a basic idle 930 having X code words, which is obtained utilizing a first line-code having a binary code word length N_idle. The idle sequence differs from the basic idle sequence in M out of the X code words. In one embodiment, the encoder 906 determines X minus M code words of the idle sequence to be equal to the corresponding X minus M code words of a basic idle sequence. The encoder 906 further determines the remaining M code words of the idle sequence to be alternative code words, which are different from the corresponding M code words of the idle sequence. In one example, the M alternative code words are not unique, i.e., each alternative code word belongs to the same output set as the code words of the idle sequence. Therefore, in one example, each alternative code word is equal to at least one code word of the basic idle sequence. In one example, each alternative code word belongs to the same output set as the code words of the second frame. Therefore, in one example, each alternative code word is equal to at least one code word of the second frame.

In one example, M equals one, and the single alternative code word is located at a predetermined distance from the end of the idle sequence. In one example, the single alternative code word is located at the end of the idle sequence. In another example, M is higher than one. In one example, the M alternative code words are located at predetermined distances from the end of the idle sequence. The M alternative code words may be consecutive, or not consecutive.

In one embodiment, the encoder 906 maintains over the idle sequence absolute value of running disparity lower than or equal to K. In one example K is lower than N_idle/2.

In one example, the first frame 916, idle sequence 918, and second frame 920 are transmitted by the transmitter 908 over the communication channel 910, and received by the second node 904. The detector 912 of the second node produces a detected first frame 622, a detected idle sequence 624, and a detected second frame 626, also referred to as the received firsts frame, the received idle sequence, and the received second frame. The code words of the detected first frame, the detected idle sequence, and the detected second frame may include one or more channel errors.

In one example, the second node 904 does not know in advance the length X of the idle sequence 918, and therefore the decoder 614 does not know in advance the starting point of the detected second frame 626. Furthermore, the decoder 614 is unable to determine the starting point of the detected second frame 626 by inspection the detected idle sequence 624 per se, since the idle sequence by itself does not indicates its end.

In one embodiment, the code words of the basic idle sequence are known in advance to the second node 904. In one embodiment, the decoder 914 compares the detected idle sequence 624 with a replica of the basic idle sequence, thereby producing a detected sequence of differences, which is the sequence of differences between the code words of the detected idle sequence 624 and the respective code words of the basic idle sequence. Based on the detected sequence of differences, the decoder 914 determines the end of the detected idle sequence 624, thereby determining the starting point of the detected second frame 626. Furthermore, the decoder 914 should be able to determine the end of the detected idle sequence 624 correctly, as long as the number of channel errors within the detected idle sequence 624 does not exceed a predetermined threshold.

In one example, the encoder 906 obtains the basic idle sequence 930 by encoding the output of a pseudorandom bit generator. In one example, the pseudorandom bit generator starts at a predetermined state. The decoder 914 may produce a replica of the basic idle sequence by utilizing the same pseudo random bit generator, starting at the same predetermined state.

In one example, the second frame 920 includes a header and a payload. In one example, the encoder encodes the header utilizing a second line-code, and the first output set of all words of the first line-code and the second output set of all code words produced by the second line-code are mutually exclusive to each other.

In one example, the encoder 906 encodes the payload utilizing a third line-code, and the third output set of all code words produced by the third line-code and the first output set have at least one common code word.

In one example, the encoder 906 encodes the payload utilizing the first line-code.

In one example, the encoder 906 encodes the payload utilizing a third line-code, and each one of the code words of the idle sequence belongs to a third output set of all code words produced by the third line-code.

In one example, the difference between the idle sequence and the basic idle sequence is measured using Hamming distance. When the idle sequence include a single alternative code word, the decoder 914 is able to determine the end of the detected idle sequence 924 as long as the number of channel errors within the detected idle sequence is lower than D_idle/2, where D_idle is the Hamming distance between the alternative code word and the respective code word in the basic idle sequence.

In one example, D_idle is equal to or higher than 3. In one example, D_idle is higher than or equal to N_idle/2. In one example, D_idle is higher than or equal to N_idle 1. In one example, D_idle equals N_idle.

In one example, the communication channel 910 includes an optical fiber. Additionally or alternatively, the communication channel may include a conductive wire, a wireless channel, and/or any other suitable communication channel.

In one example, the encoder 906 maintains the absolute value of the running disparity, from a beginning of a first frame to an end of the second frame, lower than or equal to K.

In one example, K is lower than N_idle/4. In one example, K is lower than 3. In one example, K is lower than 2.

In one example, the first output set of the first line-code is a subset of the output set of all code words of an 8b/10b line-code. In this example, each code word of the basic idle sequence is included within an output set of all code words produced by an 8b/10b line-code. In one example, the alternative code words are also included within the first output set, and therefore each code word of the idle sequence is included within the output set output set of all code words produced by an 8b/10b line-code. In one example, the first line-code is an 8b/10b line-code.

Figure 10:
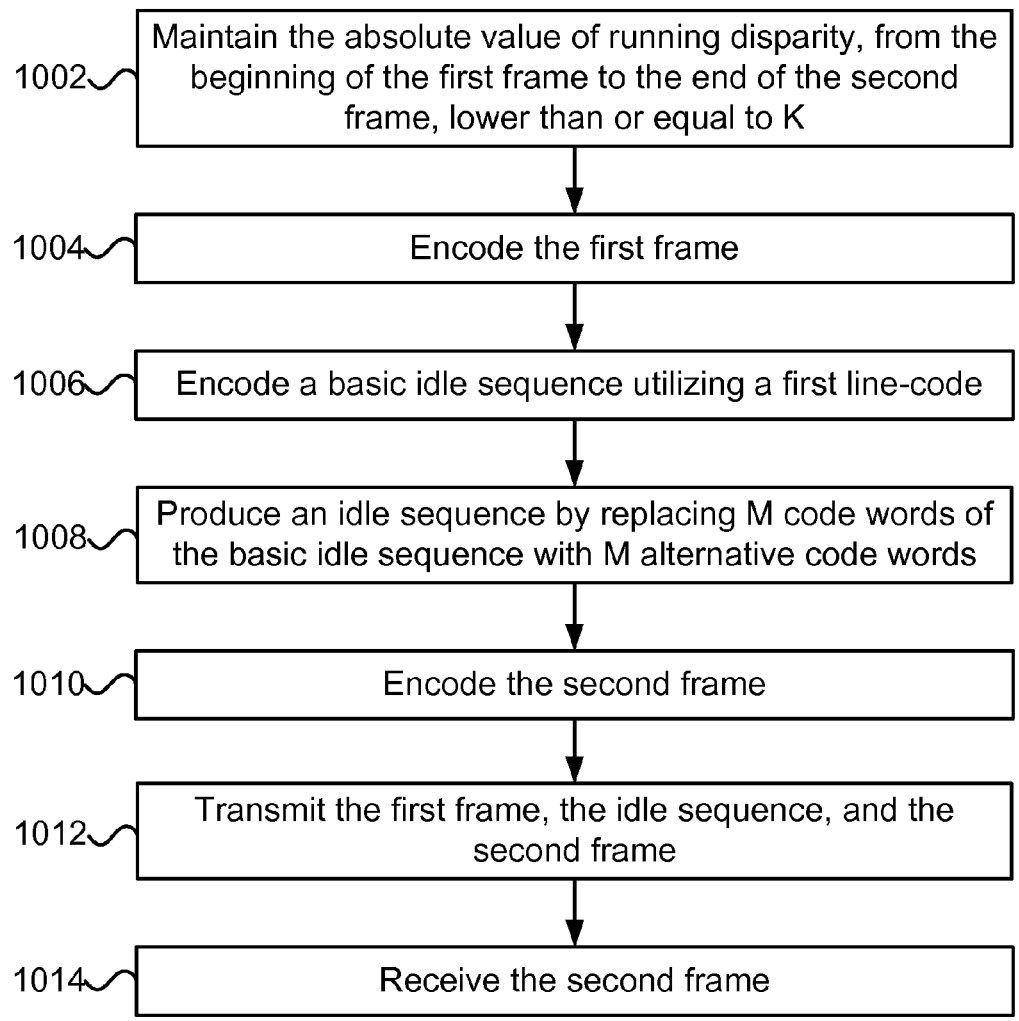
FIG. 10 illustrates one embodiment of a method for indicating the end of an idle sequence.

FIG. 10 illustrates one embodiment of a method for indicating the end of an idle sequence. The method illustrated in FIG. 10 may be performed by the first communication node 900 in FIG. 9. In addition, the method may be performed by any other communication node, or by any other suitable device. The method involves encoding and transmitting a first frame, a second frame, and an idle sequence residing between the first frame and the second frame. The first frame, idle sequence, and second frame include code words. The code words of the idle sequence have binary code word length N_idle. The method includes at least the following steps: In step 1002, maintaining, from the beginning of the first frame to the end of the second frame, the absolute value of running disparity lower than or equal to K. In one example, K is lower than N_idle/2. In step 1004, encoding the first frame. In step 1006, encoding a basic idle sequence utilizing a first line-code having a binary code word length N_idle. In step 1008, producing an idle sequence by replacing M code words of the basic idle sequence with M alternative code words. In one example, each one of the M alternative code words is equal to at least one code word of the basic idle sequence. In step 1010, encoding the second frame. In step 1012, transmitting the first frame, the idle sequence, and the second frame over a communication channel. And in step 1014, receiving the second frame by a second communication node. In one example, the second communication node is unable to determine a starting point of the second frame based only on the idle sequence and the second frame, but is able to determine the starting point of the second frame based on the difference between the basic idle sequence and the idle sequence. In one example, the difference between the basic idle sequence and the idle sequence facilitates determine the starting point of the second frame even in presence of one or more channel errors.

In one example, the step 1006 of encoding the basic idle sequence includes encoding the output of a pseudorandom bit generator, which may start at a predetermined state.

In one example, the header of the second frame is encoded utilizing a second line-code, where the first and second output sets of all code words of the first and second line-codes, respectively, are mutually exclusive to each other.

In one example, the payload of the second frame is encoded utilizing a third line-code, where the first and third output sets of all code words of the first and third line-codes, respectively, have at least one common code word.

In one example, the payload of the second frame is encoded utilizing the first line-code.

In one example, payload of the second frame is encoded utilizing a third line-code, where each one of the code words of the idle sequence belongs to a third output set of all code words of the third line-code.

In one example, the difference between the idle sequence and the basic idle sequence is measured using Hamming distance. When the idle sequence includes a single alternative code word, the second communication node is able to determine the end of the idle sequence as long as the number of channel errors within the idle sequence is lower than D_idle/2, where D_idle is the Hamming distance between the alternative code word and the respective code word in the basic idle sequence.

In one example, D_idle is equal to or higher than 3. In one example, D_idle is higher than or equal to N_idle/2. In one example, D_idle is higher than or equal to N_idle 1. In one example, D_idle equals N_idle.

In one example, K is lower than N_idle/4. K may optionally be lower than 3, or lower than 2.

In one example, the first output set of the first line-code is a subset of the output set of all code words produced by an 8b/10b line-code. In this example, each code word of the basic idle sequence is included within an output set of all code words produced by an 8b/10b line-code. In one example, the alternative code words are also included within the first output set, and therefore each code word of the idle sequence is included within the output set output set of all code words produced by an 8b/10b line-code. In one example, the first line-code is an 8b/10b line-code.

Herein, a predetermined value, such as a predetermined confidence level or a predetermined threshold, is a fixed value and/or a value determined any time before performing a calculation that compares a certain value with the predetermined value. A value is also considered to be a predetermined value when the logic, used to determine whether a threshold that utilizes the value is reached, is known before start of performing computations to determine whether the threshold is reached.

In this description, references to "one embodiment" mean that the feature being referred to may be included in at least one embodiment of the invention. Moreover, separate references to "one embodiment" or "some embodiments" in this description do not necessarily refer to the same embodiment. Additionally, references to "one embodiment" and "another embodiment" may not necessarily refer to different embodiments, but may be terms used, at times, to illustrate different aspects of an embodiment.

The embodiments of the invention may include any variety of combinations and/or integrations of the features of the embodiments described herein. Although some embodiments may depict serial operations, the embodiments may perform certain operations in parallel and/or in different orders from those depicted. Moreover, the use of repeated reference numerals and/or letters in the text and/or drawings is for the purpose of simplicity and clarity and does not in itself dictate a relationship between the various embodiments and/or configurations discussed. The embodiments are not limited in their applications to the details of the order or sequence of steps of operation of methods, or to details of implementation of devices, set in the description, drawings, or examples. Moreover, individual blocks illustrated in the figures may be functional in nature and therefore may not necessarily correspond to discrete hardware elements.

While the methods disclosed herein have been described and shown with reference to particular steps performed in a particular order, it is understood that these steps may be combined, sub-divided, and/or reordered to form an equivalent method without departing from the teachings of the embodiments. Accordingly, unless specifically indicated herein, the order and grouping of the steps is not a limitation of the embodiments. Furthermore, methods and mechanisms of the embodiments will sometimes be described in singular form for clarity. However, some embodiments may include multiple iterations of a method or multiple instantiations of a mechanism unless noted otherwise. For example, when a processor is disclosed in one embodiment, the scope of the embodiment is intended to also cover the use of multiple processors. Certain features of the embodiments, which may have been, for clarity, described in the context of separate embodiments, may also be provided in various combinations in a single embodiment. Conversely, various features of the embodiments, which may have been, for brevity, described in the context of a single embodiment, may also be provided separately or in any suitable sub-combination. Embodiments described in conjunction with specific examples are presented by way of example, and not limitation. Moreover, it is evident that many alternatives, modifications, and variations will be apparent to those skilled in the art. It is to be understood that other embodiments may be utilized and structural changes may be made without departing from the scope of the embodiments. Accordingly, this disclosure is intended to embrace all such alternatives, modifications, and variations that fall within the spirit and scope of the appended claims and their equivalents.

What is claimed is:

1. A communication node comprising:
an encoder and a transmitter;
the encoder is configured to encode a first part of a frame utilizing a first line-code having a binary code word length $N'$ and a minimal Hamming distance $D'$;
the encoder is further configured to encode a second part of the frame utilizing a second line-code having a binary code word length equal to $N''$ and a minimal Hamming distance $D''$ lower than $D'$;
the encoder is further configured to maintain over the frame absolute value of running disparity lower than or equal to K, wherein K is lower than both $N'/2$ and $N''/2$; and
the transmitter is configured to transmit the encoded frame over a communication channel.

2. The communication node of claim 1, wherein the running disparity at a certain symbol is a difference between number of ones and number of zeroes encoded up to and including the certain symbol.

3. The communication node of claim 1, wherein K is lower than both $N'/4$ and $N''/4$.

4. The communication node of claim 1, wherein K is lower than 3.

5. The communication node of claim 1, wherein $N''$ is equal to $N'$, and a first output set consisting of all code words produced by the first line-code and a second output set consisting of all code words produced by the second line-code are mutually exclusive to each other.

6. The communication node of claim 1, wherein a first output set consisting of all code words produced by the first line-code is a subset of a second output set consisting of all code words produced by the second line-code.

7. The communication node of claim 1, wherein the first part of the frame comprises an indication that the second part of the frame is encoded utilizing the second line-code.

8. The communication node of claim 1, wherein the encoder is further configured to produce an idle sequence comprising code words of length N_idle, and to maintain the absolute value of the running disparity over the idle sequence lower than or equal to K, wherein K is further lower than N_idle/2.

9. The communication node of claim 1, wherein the encoder is further configured to encode a following frame, and to maintain the absolute value of the running disparity, from beginning of the frame to end of the following frame, lower than or equal to K.

10. The communication node of claim 1, wherein the encoder is further configured to encoding first and second parts of a following frame, utilizing the first line-code and a third line-code, respectively; the third line-code has a binary code word length equal to $N'''$ and a minimal Hamming distance $D'''$ lower than $D'$; and further comprising maintaining from a beginning of the frame to an end of the following frame the absolute value of the running disparity lower than or equal to K, wherein K is further lower than $N'''/2$.

11. A communication system comprising:
a first node configured to communicate with a second node over a communication channel;
the first node comprises an encoder and a transmitter;
the encoder is configured to encode a first part of a frame utilizing a first line-code having a binary code word length $N'$ and a minimal Hamming distance $D'$;
the encoder is further configured to encode a second part of the frame utilizing a second line-code having a binary code word length equal to $N''$ and a minimal Hamming distance $D''$ lower than $D'$;

the encoder is further configured to maintain over the frame absolute value of running disparity lower than or equal to K, wherein K is lower than both N'/2 and N"/2;

the transmitter is configured to transmit the frame over the communication channel;

the second node comprises a detector and a decoder;

the detector is configured to detect the frame; and the decoder is configured to decode the first part, utilizing the first line-code, and to decode the second part, utilizing the second line-code.

12. The communication system of claim 11, wherein a first output set consisting of all code words produced by the first line-code is a subset of a second output set consisting of all code words produced by the second line-code.

13. The communication system of claim 11, wherein the first part of the frame comprises an indication that the second part of the frame is encoded utilizing the second line-code, and the decoder is further configured to decode the second part of the frame based on the indication.

14. A method for encoding a frame utilizing at least two line-codes having different minimal Hamming distances, comprising:

maintaining over the frame absolute value of running disparity lower than or equal to K while:

encoding a first part of the frame utilizing a first line-code having a binary code word length N' and a minimal Hamming distance D'; and encoding a second part of the frame utilizing a second line-code having a binary code word length N" and a minimal Hamming distance D" lower than D';

wherein K is lower than both N'/2 and N"/2.

15. The method of claim 14, wherein K is lower than 3.

16. The method of claim 14, wherein N" is equal to N', and a first output set consisting of all code words produced by the first line-code and a second output set consisting of all code words produced by the second line-code are mutually exclusive to each other.

17. The method of claim 14, wherein a first output set consisting of all code words produced by the first line-code is a subset of a second output set consisting of all code words produced by the second line-code.

18. The method of claim 14, wherein the first part of the frame comprises an indication that the second part of the frame is encoded utilizing the second line-code.

19. The method of claim 14, further comprising producing an idle sequence comprising code words of length N_idle, and maintaining the absolute value of the running disparity over the idle sequence lower than or equal to K, wherein K is further lower than N_idle/2.

20. The method of claim 14, further comprising encoding a following frame, and maintaining the absolute value of the running disparity, from beginning of the frame to end of the following frame, lower than or equal to K.

21. The method of claim 14, further comprising encoding first and second parts of a following frame, utilizing the first line-code and a third line-code, respectively; the third line-code has a binary code word length equal to N'" and a minimal Hamming distance D'" lower than D'; and further comprising maintaining from a beginning of the frame to an end of the following frame the absolute value of the running disparity lower than or equal to K, wherein K is further lower than N'"/2.

* * * * *